(12) United States Patent
Hulbert et al.

(10) Patent No.: US 7,191,416 B2
(45) Date of Patent: Mar. 13, 2007

(54) SYSTEM AND METHOD FOR MODIFYING INTEGRATED CIRCUIT HOLD TIMES

(75) Inventors: Andrew Hulbert, Bristol (GB); Enrico Gregoratto, Bristol (GB)

(73) Assignee: STMicroelectronics Limited, Bristol (GB)

( * ) Notice: Subject to any disclaimer, the term of this patent is extended or adjusted under 35 U.S.C. 154(b) by 286 days.

(21) Appl. No.: 10/352,799

(22) Filed: Jan. 27, 2003

(65) Prior Publication Data

US 2004/0148583 A1 Jul. 29, 2004

(51) Int. Cl.
*G06F 17/50* (2006.01)

(52) U.S. Cl. ............................................. 716/6; 716/10

(58) Field of Classification Search .................... 716/4, 716/6, 11
See application file for complete search history.

(56) References Cited

U.S. PATENT DOCUMENTS

| | | | | |
|---|---|---|---|---|
| 5,426,591 A | * | 6/1995 | Ginetti et al. ................... | 716/6 |
| 5,764,528 A | * | 6/1998 | Nakamura ....................... | 716/6 |
| 5,859,776 A | * | 1/1999 | Sato et al. ................... | 700/121 |
| 5,896,299 A | * | 4/1999 | Ginetti et al. ................... | 716/4 |
| 5,983,376 A | * | 11/1999 | Narayanan et al. ......... | 714/726 |
| 6,009,248 A | * | 12/1999 | Sato et al. ...................... | 716/2 |
| 6,425,115 B1 | * | 7/2002 | Risler et al. ................... | 716/17 |
| 6,480,994 B1 | * | 11/2002 | Tetelbaum et al. ............ | 716/10 |
| 6,487,707 B1 | * | 11/2002 | Kamiya ......................... | 716/8 |
| 6,493,854 B1 | * | 12/2002 | Chowdhury et al. ........... | 716/6 |
| 6,546,531 B1 | * | 4/2003 | Quach et al. ................... | 716/6 |
| 6,606,736 B1 | * | 8/2003 | Kobayashi et al. ........... | 716/10 |
| 6,651,224 B1 | * | 11/2003 | Sano et al. ..................... | 716/2 |
| 6,681,373 B1 | * | 1/2004 | Zolotykh et al. .............. | 716/2 |
| 6,871,329 B2 | * | 3/2005 | Matsumoto .................... | 716/4 |
| 2003/0051222 A1 | * | 3/2003 | Williams et al. .............. | 716/12 |
| 2003/0101399 A1 | * | 5/2003 | Yoshikawa ..................... | 714/744 |
| 2005/0268263 A1 | * | 12/2005 | Sun et al. ...................... | 716/6 |

OTHER PUBLICATIONS

N.V. Shenoy et al., Minimum Padding to satisfy Short Path COnstraints, IEEE/ACM International Conference on Computer-Aided Design, pp. 156-161, Nov. 1993.*

* cited by examiner

*Primary Examiner*—Leigh M. Garbowski
(74) *Attorney, Agent, or Firm*—Lisa K. Jorgenson; Robert Iannucci; Seed IP Law Group PLLC

(57) ABSTRACT

A method of arranging an integrated circuit to correct for hold time errors comprises fixing the position of existing cells in a design, determining hold time errors required to be corrected and placing buffer cells in spaces in the existing design. By placing buffer cells in spaces in the existing design, rather than moving cells in the existing design, the hold time can be corrected without changing the critical path.

16 Claims, 4 Drawing Sheets

SYSTEM AND METHOD FOR MODIFYING INTEGRATED CIRCUIT HOLD TIMES

BACKGROUND OF THE INVENTION

1. Field of the Invention

The present invention relates to an integrated circuit design system, in particular a computer aided design (CAD) system, and to a method of circuit design.

2. Description of the Related Art

In designing an integrated circuit (IC) layout, it is necessary to take a number of timing factors into account. Between any two clocked components in an integrated circuit (such as latches) there is a "critical path" and in the circuit as a whole there is a "fastest path."

The critical path is the slowest path between two clocked components, that is the longest time that data from one component takes to reach the other. The maximum speed of the IC as a whole is determined by the critical path.

The fastest path is the shortest time for data at one clocked component to reach another. Where there is a small number of components between any two clocked components the fastest path can, in fact, be too fast with the result that errors occur due to signals arriving too quickly.

We have appreciated the need to design integrated circuits for best performance by balancing both the critical and fastest paths in a design. In particular, we have appreciated that the critical path should not be adversely affected when adjusting the fastest path.

BRIEF SUMMARY OF THE INVENTION

The invention is defined in the independent claims to which reference is directed. Preferred features are set out in the dependent claims.

In a system aspect, an embodiment of the invention comprises a computer aided design system configured to calculate a delay required to adjust the fastest path and to lay out buffer components in spaces within an IC design without moving other components. This has the advantage that the fastest path can be adjusted without affecting the critical path.

In a method aspect, an embodiment comprises a method of arranging an integrated circuit in which a delay required to adjust the fastest path is calculated, the components required to provide such a delay determined, and said components inserted into the integrated circuit in gaps between existing components without moving those existing components. This method ensures the production of an IC with the required fastest path without affecting the critical path.

DETAILED DESCRIPTION OF THE INVENTION

The invention is embodied in a method of arranging an integrated circuit and in a system configured to arrange an integrated circuit according to the method. Computer Aided Design (CAD) systems for chip design are known and need not be described herein in full. The implementation on a CAD system is a matter of changing parameters of the CAD system.

As previously noted, a problem in IC layout design is that of fixing the slowest timing paths (the critical path) whilst also ensuring that the fastest timing paths meet the design targets. One embodiment ensures the slowest path remains unchanged when adding extra logic gates to slow the fastest timing paths in the design of an IC layout. The additional time delay required to be added to the fastest timing path is the "hold time."

Figure 2:
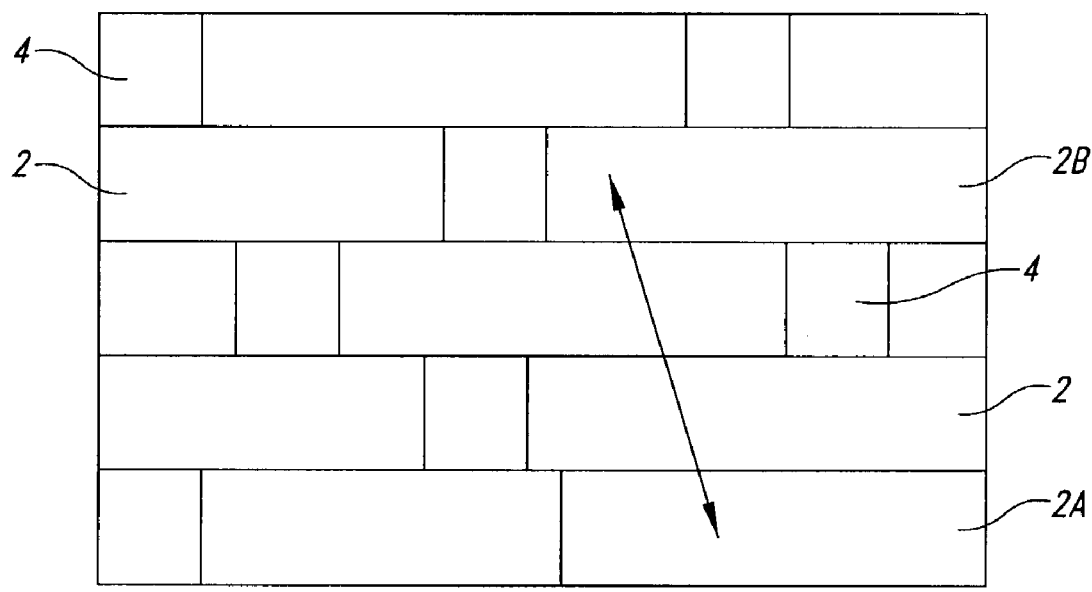
FIG. 2 shows a cell placement in an integrated circuit.

In standard IC design, components such as latches, gates, etc, known as "cells" 2 are placed in abutting rows as shown in FIG. 2. To allow for interconnections between cells 2, there is some unused space 4. In existing CAD tools the addition of extra logic gates to correct the hold time is done by placing the new gates and, if the space available is insufficient, existing overlapping gates are moved until overlaps are removed.

For example, FIG. 2 shows two clocked cells 2A, 2B that have a fastest path that needs to be slowed down.

Figure 3:
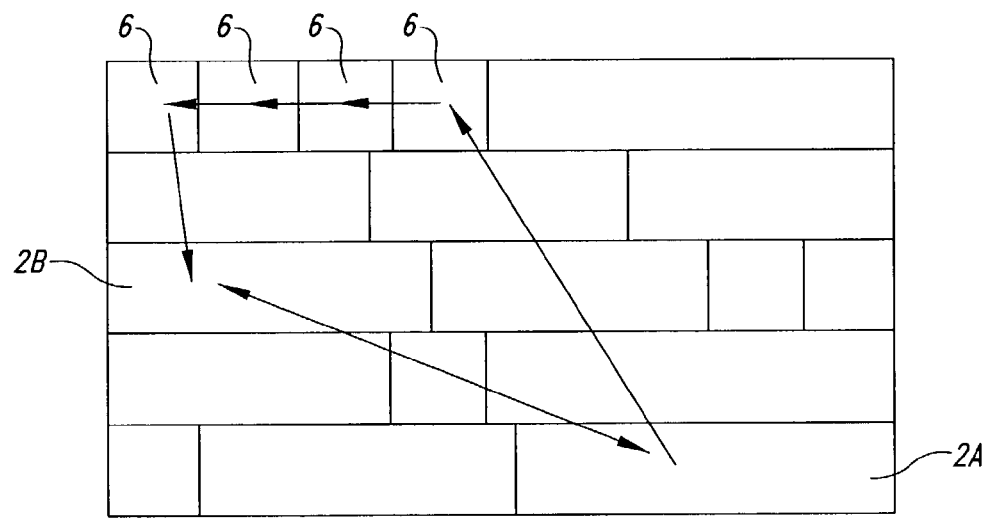
FIG. 3 shows a known technique for arranging the cell placement of FIG. 2.

The known design technique is shown in FIG. 3. As can be seen, the fastest path between the two components 2A, 2B is adjusted by the addition of four buffer cells 6 and moving the existing cells accordingly. If the hold time violation is large, then large cells are added with large gate input capacitances to add extra capacitance on the interconnect to meet the design targets. As noted, though, this can change the timings on the critical path of the design due to the changes in interconnect capacitance due to routing topology changes on moved cells.

Figure 1:
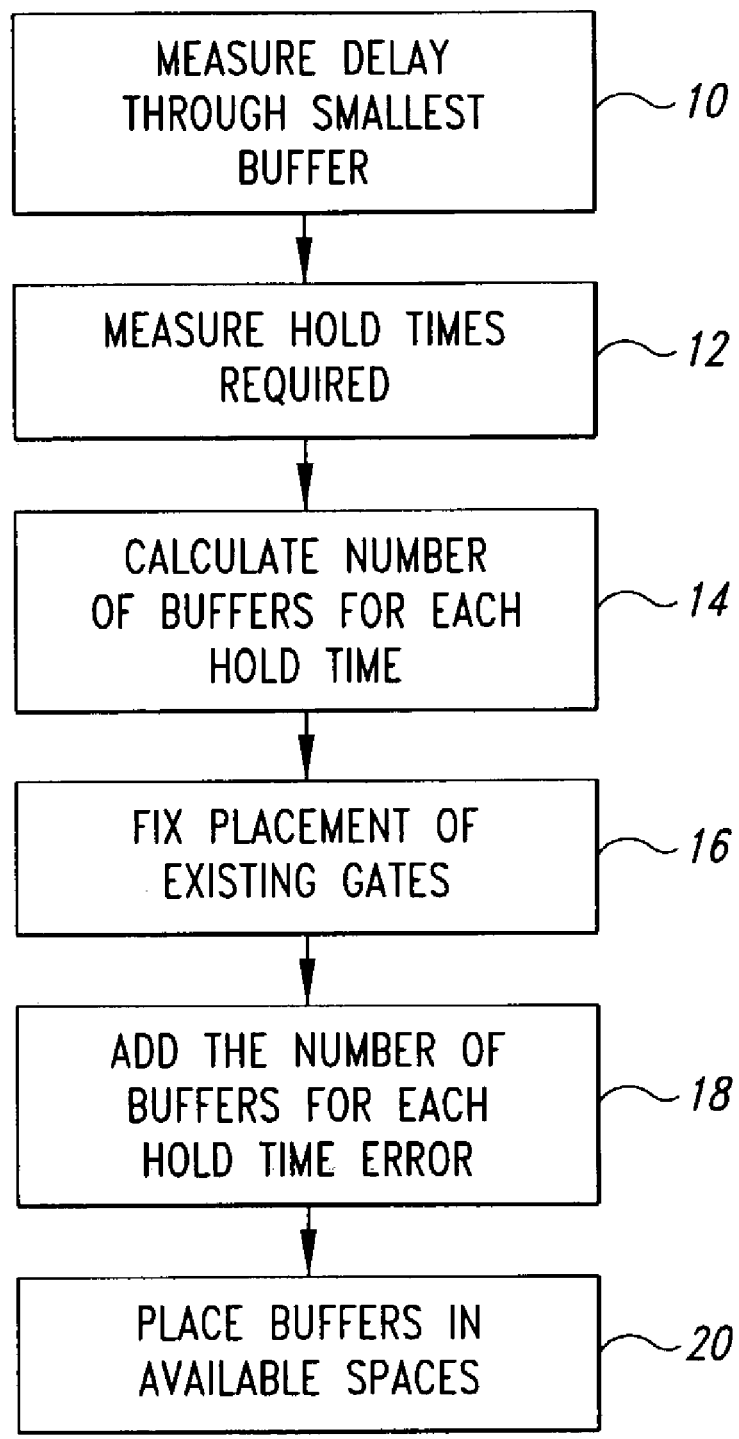
FIG. 1 shows the process of arranging an integrated circuit according to an embodiment of the invention.

The method according to one embodiment of the present invention is shown in FIG. 1 and fixes the hold time of the fastest timing paths by using the spare space between standard cells without the need to move cells because of placing larger cells than the space available.

In a first step 10, the intrinsic delay through the smallest buffer available is measured and stored as parameter: Delay_thru_small_buffer. Then at step 12, the hold time errors in the IC are measured and a list of hold time errors produced. For each hold time error, at step 14, the number of small buffers that would be required to fix the error is calculated. This number is given by:

$$\text{Number\_of\_buffers} = \frac{\text{Hold time error}}{\text{Delay\_thro\_small\_buffer}}.$$

For each hold time error, the number of buffers so determined is noted to be added to the arrangement, rounded to the nearest integer, e.g., 2.5 buffers is incremented to 3; 0.5 is incremented to 1.0. Then, at step 16, the placement of existing gates is fixed, prior to adding the required buffers in the available spaces and placing them in the arrangement at steps 18 and 20. Lastly, the connections on the IC layout are rerouted to complete the connections.

The size of the buffers 6 can be characterized in relation to a standard cell library. The standard cell library (the basic elements for IC design) has a range of sizes of gates explained in units of placement grids. All standard cells are placed on a placement grid.

A placement grid for 0.13um process is 0.41um (microns) wide. Small buffers are typically between 2 and 4 placement grid pitches (0.82um to 1.64um) approximately. The white space in between standard cells in the cell placement ranges from 1 to a bigger number depending on the density of the layout.

Standard cell libraries have the same cell defined many of different sizes to drive different capacitances. A "small" cell for a 0.13um process technology is typically buffers of size 4 placement pitches or less (1.64 um). The largest buffer in our library is an X12 strength and is 12 placement pitches wide (4.92um). The smallest buffers are 2 to 4 pitches wide.

Figure 4:
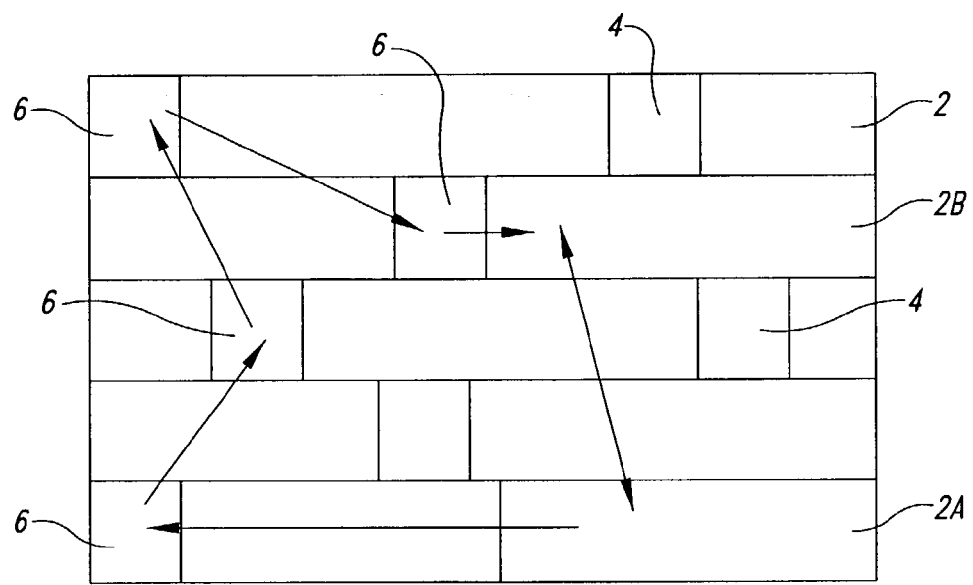
FIG. 4 shows a method for arranging the integrated circuit cell placement of FIG. 2 according to an embodiment of the invention.

An example resulting IC arrangement is shown in FIG. 4. As can be seen, the spaces have now been used for buffer cells 6 without moving any existing cells.

In a CAD system embodiment, the system is programmed in a known fashion to undertake the new steps described herein.

Figure 5:
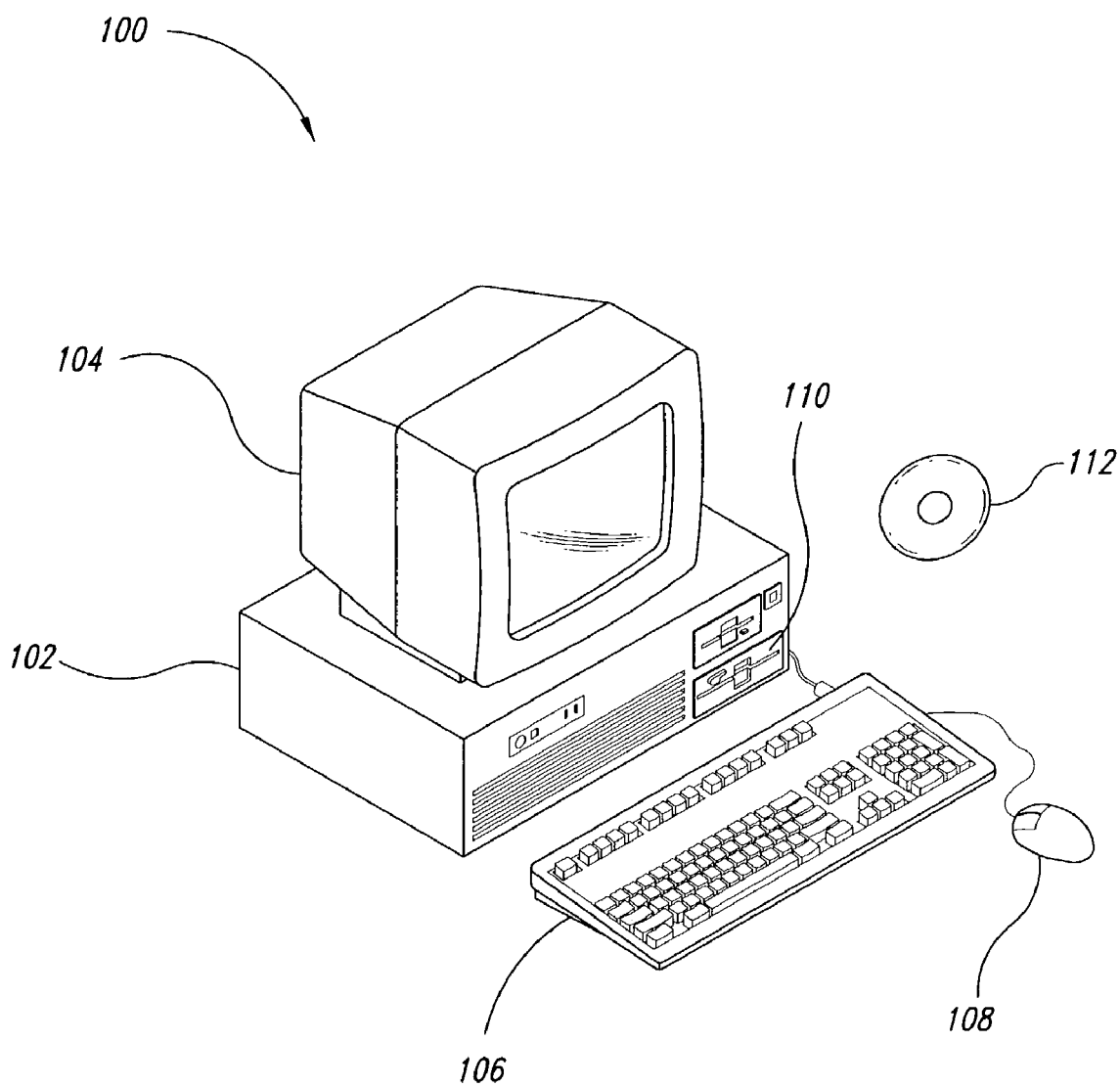
FIG. 5 is a diagram of a CAD system for implementing an embodiment of the invention.

FIG. 5 shows a CAD system 100 having a computer 102, a user interface including a display 104, keyboard 106 and mouse 108. The computer 102 may employ the user interface elements to display a graphical user interface (GUI) to allow a user to interact with the computer 102. The computer 102 can be any conventional computer such as a personal computer, workstation, minicomputer, mainframe or supercomputer. The computer 102 includes a processor (not shown) to execute instructions and computer readable media for storing instructions, for example, memory (not shown) such as random access memory (RAM) and/or read only memory (ROM). The computer 102 also includes a drive 110 for reading removable computer readable media, such as floppy disks, CD-ROMs, Winchester disks, or optical disks 112. The memory or removable computer readable media can store instructions for causing the computer 102 to automatically perform the processes taught herein.

Finally, it is clear that numerous modifications and variations may be made to the resistive element described and illustrated herein, all falling within the scope of the invention, as defined in the attached claims.

The invention claimed is:

1. A method of arranging an integrated circuit to correct for a hold time error between existing cells, comprising:
   determining a hold time error delay for placement of one or more buffer cells between the existing cells on the integrated circuit;
   determining a number of buffer cells that add the hold time error delay;
   fixing positions of the existing cells; and
   placing the number of buffer cells in spaces between the existing cells to correct the hold time error, without moving the existing cells.

2. A method according to claim 1, further comprising selecting the buffer cells to be of a size that fit into the spaces between the existing cells without moving the existing cells.

3. A method according to claim 1, wherein the buffer cells are in a range from 0.82 to 1.64 microns.

4. A method according to claim 1, further comprising determining a delay through each buffer cell, wherein determining a number of buffer cells comprises dividing the hold time error delay by the delay through each buffer cell.

5. A method of instructing a computer aided design (CAD) system to arrange an integrated circuit to correct for a hold time error, comprising instructing the CAD system to:
   determine a hold time error delay for placement of one or more buffer cells between existing cells on the integrated circuit;
   determine a number of buffer cells that add the hold time error delay;
   fix positions of the existing cells; and
   place the number of buffer cells in spaces between the existing cells to correct the hold time error, without moving the existing cells.

6. The method of claim 5, further comprising instructing the CAD system to select the buffer cells to be of a size that fit into the spaces between the existing cells without moving the existing cells.

7. A method according to claim 5, wherein the buffer cells are in a range from 0.82 to 1.64 microns.

8. The method of claim 5, wherein the system is further instructed to determine a delay through each buffer cell, and determine the number of buffer cells by dividing the hold time error delay by the delay through each buffer cell.

9. A computer aided design (CAD) system for arranging an integrated circuit, comprising:
   means for determining a hold time error delay for placement of one or more buffer cells between existing cells on the integrated circuit;
   means for determining a number of buffer cells that add the hold time error delay;
   means for fixing positions of the existing cells; and
   means for placing the number of buffer cells in spaces between the existing cells, without moving the existing cells.

10. A system according to claim 9, further comprising means for selecting the buffer cells to be of a size that fit into the spaces between the existing cells without moving the existing cells.

11. A system according to claim 9, further comprising means for determining a delay through each buffer cell, wherein the means for determining the number of buffer cells includes means for dividing the hold time error delay by a delay through each buffer cell.

12. A system according to claim 9, wherein the buffer cells are in a range from 0.82 to 1.64 microns.

13. A computer-readable memory medium comprising instructions which when executed by a process in a computer aided design (CAD) system arranges cells of an integrated circuit by:
   determining a hold time error delay for placement of one or more buffer cells between existing cells of the integrated circuit;
   determining a number of buffer cells that add the hold time error delay;
   fixing positions of the existing cells; and
   placing the number of buffer cells in spaces between the existing cells to correct the hold time error, without moving the existing cells.

14. The computer-readable memory medium of claim 13, further comprising instructions for selecting the buffer cells to be of a size that fit into the spaces between the existing cells without moving the existing cells.

15. The computer-readable memory medium of claim 13, wherein the buffer cells are in a range from 0.82 to 1.64 microns.

16. The computer-readable memory medium of claim 13, further comprising instructions for determining a delay through each buffer cell, wherein the instructions for controlling the processor to determine the number of buffer cells include instructions for controlling the processor to divide the hold time error delay by the delay through each buffer cell.

* * * * *